United States Patent [19]

Anderegg et al.

[11] Patent Number: 4,533,787
[45] Date of Patent: Aug. 6, 1985

[54] PRINTED CIRCUIT ASSEMBLY

[75] Inventors: Fredy Anderegg, Lohn; Josef Furrer, Luterbach; Heinz Däppen, Flumenthal, all of Switzerland

[73] Assignee: Autophon AG., Soleure, Switzerland

[21] Appl. No.: 440,999

[22] Filed: Nov. 12, 1982

[30] Foreign Application Priority Data

Nov. 26, 1981 [CH] Switzerland ............... 7559/81

[51] Int. Cl.³ ............................................. H05K 1/03
[52] U.S. Cl. ................... 174/68.5; 174/117 A; 361/398; 361/412
[58] Field of Search ............. 174/68.5, 117 A, 117 FF, 174/117 F; 361/412, 398

[56] References Cited

U.S. PATENT DOCUMENTS

| | | | |
|---|---|---|---|
| 3,471,348 | 10/1969 | Shaheen et al. | 174/68.5 X |
| 4,026,011 | 5/1977 | Walton | 174/68.5 X |
| 4,255,853 | 3/1981 | Campillo et al. | 174/117 F X |
| 4,355,199 | 10/1982 | Luc | 174/68.5 |
| 4,375,379 | 3/1983 | Luetzow | 174/117 F X |

*Primary Examiner*—R. R. Kucia
*Attorney, Agent, or Firm*—Oblon, Fisher, Spivak, McClelland & Maier

[57] ABSTRACT

Certain regions of a printed circuit assembly having mechanically laid wires are formed of two parallel sheets of polyimide film, the circuit assembly being flexible in those regions. The edges of these sheets of film are secured in the region of the edges of the rigid parts of the assembly by means of thermally activated adhesives. In the flexible regions, the wires are embedded in a thermally activated adhesive layer held between the two sheets of polyimide film. This adhesive layer, unlike adhesive layers on the rigid parts, contains no fabric.

2 Claims, 1 Drawing Figure

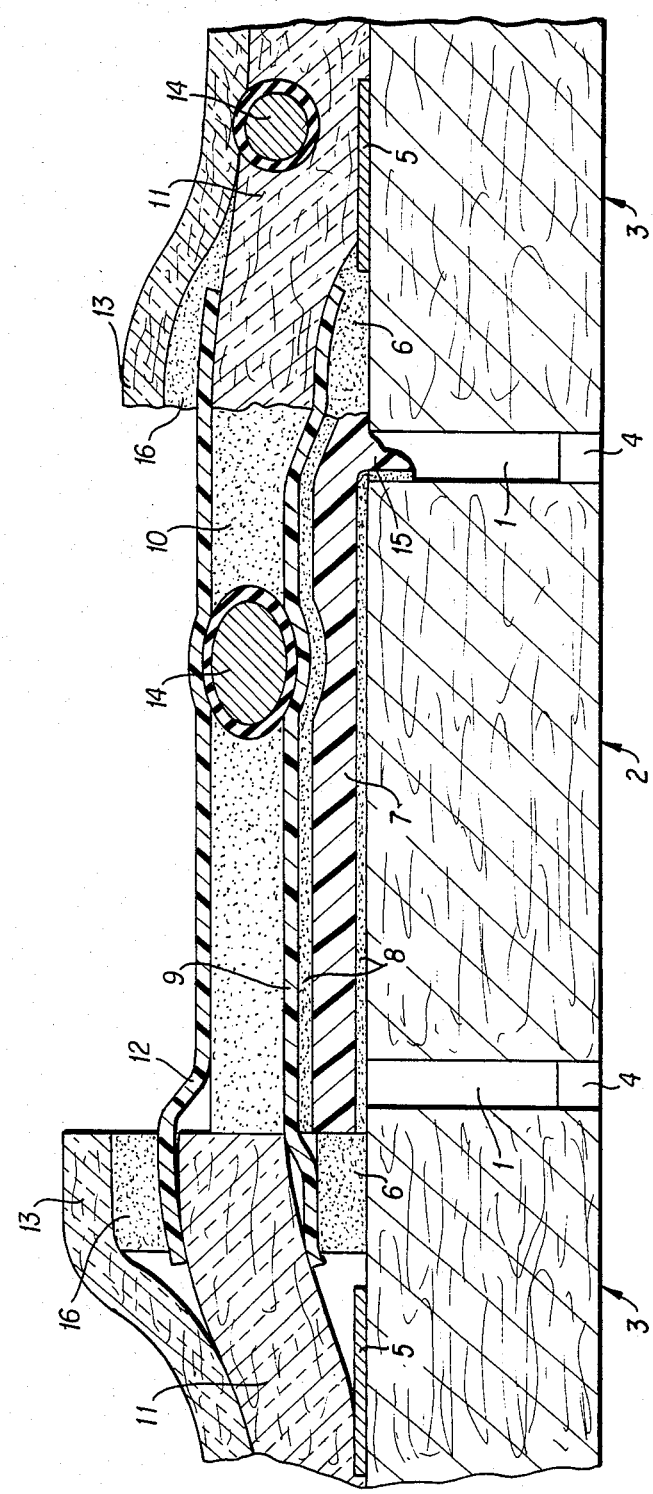

PRINTED CIRCUIT ASSEMBLY

This invention relates to electric circuits and wiring, and more particularly to a printed circuit assembly of the type having rigid and flexible parts, in which each two rigid parts are connected by a flexible part, and in which the rigid parts each include a lower first layer and an upper second layer, each containing a glass-fiber fabric and a thermally activatable adhesive, applied to a rigid board, mechanically laid wires being embedded in the first layer.

The prior art includes printed circuits made of rigid material to which at least two layers of a thermally activated adhesive are applied, with mechanically-laid insulated wiring being embedded in one of the layers and covered with the other. Such printed circuits are sold by Kollmorgen Inc., Glen Cove, N.Y., under the trademark "Multiwire". They have the advantage over conventional printed circuits that wire crossovers and a greater packing density are possible and the one-time preparations for a production run are fewer.

As in the case of conventional printed circuits, the walls of the holes must also be copper-plated in the case of wired printed circuits so that the leads inserted in these holes for connecting the components to be mounted can be properly soldered and also so that various levels of conductors can be connected via the holes. However, it is more difficult to apply such copper-plating in the case of wired printed circuits than in conventional ones. The latter are provided with holes before the conductor strips are applied, then immersed in a bath from which a very thin deposit of copper is precipitated by purely chemical means. The deposit in the holes is thereafter galvanically reinforced.

In the case of printed circuits having mechanically applied wires, however, such reinforcement by electroplating cannot be utilized. There the copper coating on the walls of the holes is produced by including in the material of the board and of the adhesive layers applied thereto a catalyst which, in cooperation with a suitable bath, makes it possible to deposit a sufficient thickness of copper by purely chemical means, without the use of electricity. The copper-plating is restricted to the holes by appropriate masking of the board.

Flexible "printed circuits" have been proposed which can be combined with rigid circuit boards in such a way that printed circuit assemblies having rigid parts with flexible parts between them can be produced without the use of soldered joints or plugs. Such printed circuits are taught, for example, in German Disclosed application (DOS) No. 26 57 212. In the case of the circuits described there, etched conductor patterns run uninterruptedly over rigid and flexible parts. They are manufactured starting from a known type of flexible "printed circuit" in which conductor patterns are produced by etching on one or both sides of a preferably polyimide film and covered by other films. Separate zones of such a flexible circuit are then cemented to or between rigid printed circuits, and the conductor strips of both types of circuits are interconnected through copper-plated holes.

It would seem logical to use the prior art technology also for printed circuits in which mechanically laid wires are embedded. However, the obstacles to doing so are, for one thing, that the polyimide films entering into consideration for the flexible parts do not contain any catalyst and, for another thing, that the material used until now for embedding the wires is not flexible enough. This material must meet special requirements inasmuch as the wires are cemented to it, embedded in it, and are furthermore supposed to be secured against lateral displacement, and inasmuch as its surface should make possible good adhesion of the wires when laid as well as the formation of a strongly adhering copper coating; it contains a glass-fiber fabric which is primarily responsible for the aforementioned drawback.

Hence polyimide film cannot be used in the rigid parts, where there must be holes with copper-plated walls, while the material in which the wires are embedded on the rigid base plates is not usable in the flexible part.

The present invention is based upon the realization that no holes need be bored in the flexible part and that the requirements to be met by the material for the flexible parts are much lower than for the corresponding material on the rigid parts. Hence it follows that other materials can be used for the flexible parts than for the rigid parts insofar as the use of these materials is limited to the flexible parts. Thus, in the flexible regions, polyimide film can be used as the substrate, and for embedding the wires materials can be used, which besides flexibility, need only meet the requirement that the wires adhere to it somewhat when being laid.

It is an object of this invention to provide a printed circuit assembly having wiring mechanically laid on rigid and flexible parts made of different materials, the wiring running over these different parts being nonetheless continuous, as well as a method of manufacturing such an assembly.

To this end, in the printed circuit assembly according to the present invention, of the type initially mentioned, the flexible parts each comprise a non-adhesive, flexible upper film and lower film running solely between the rigid parts and attached in edge zones of the rigid parts, and there are wires which run uninterruptedly from one of the rigid parts over a flexible part to the adjacent rigid part and, in so doing, are embedded in the flexible part in a third layer which is inserted between the two non-adhesive films, connects the two films, and is made of a fiber-free, thermally activatable adhesive.

In one embodiment of the invention, further adhesive layers are applied in the mentioned edge zones for attaching the edges of the non-adhesive films.

A preferred embodiment of the invention will now be described in detail with reference to the accompanying drawing, which is a cross-section through a three-part printed circuit assembly in one of the last phases of manufacture.

It should be noted in connection with the drawing that the thicknesses of the layers are shown on a scale approximately 20 times greater than that of the lengths, except as concerns the wires. The wires running perpendicular to the plane of the drawing are round; those which run parallel to the plane of the drawing and can therefore not be shown correctly are depicted as being cut at an angle. Hence the oval shape of the latter does not indicate any deformation of these wires, as might wrongly be supposed. On the left-hand side of the drawing, the layers are shown as they lie one upon the other in their uncompressed state, whereas the right-hand side shows the situation after compression and bonding.

The drawing shows a rigid base plate or board of glass-fiber-reinforced epoxy material which is divided by slots 1 into an inner region 2 and outer regions 3. Except for crosspieces 4, slots 1 are continuous. Board parts 2 and 3 are temporarily held together by means of crosspieces 4 but can easily be broken apart. The two outer parts 3 of the board subsist as rigid printed circuits, whereas the middle part 2 is subsequently removed.

Parts 3 exhibit a conductor pattern 5 applied conventionally by etching; this conductor structure serves the primary purpose of supplying power and grounding and has nothing to do with the operations and arrangements to be described hereinafter.

Regions 3 of the board, forming the rigid parts, are fundamentally each provided with a first layer 11 of material suitable for receiving wire 14 embedded therein, and with a second layer 13 of covering material. This structure corresponds to a normal rigid printed circuit with inlaid wires. Both layers 11 and 13 contain a glass-fiber fabric and a thermally activated epoxy-resin adhesive; layer 13 is of the material of this type known in the trade as "prepreg". The glass-fiber fabric in the first layer 11 prevents lateral displacement of the wires, and its composition makes possible faultless copper-plating of holes (not shown) and connection of this layer of copper to the wires intersected by the holes.

Inserted between the base plate and the first layer 11, and between the first and second layers 11, 13, in the area of an edge zone, are sheets 9 and 12, respectively, of the non-adhesive polyimide film sold under the trademark "Kapton" by E. I. du Pont de Nemours & Co., Wilmington, Del. These films are attached within the edge zones to board part 3 and to layer 13 by adhesive layers 6 and 16, respectively. Layers 6 and 16 are likewise of thermally activated material, preferably of the acrylate material sold under the trademark "Pyralux LF 0100" by E. I. du Pont de Nemours & Co.

By bonding polyimide films 9 and 12 with the aid of strips 6 and 16, and owing to the glass-fiber fabric contained in layers 11 and 13, a high-strength connection between board parts 3 and films 9 and 12 is obtained.

Polyimide films 9 and 12 are bonded together by a layer 10 of the fiber-free, thermally activated adhesive sold under the trademark "Scotch-Weld 588" by Minnesota Mining and Manufacturing Company, St. Paul, Minn. This adhesive, a mixture of synthetic elastomer and thermosetting resin, is generally used for cementing brake linings and clutch facings or for gluing signs to a supporting structure.

Embedded in layers 11 and 10 are mechanically laid wires 14 which run uninterruptedly from one of the rigid parts 3 over the flexible part 2 consisting of films 9 and 12 with adhesive layer 10 between them to the other rigid part 3 and are thus undetachably secured to all three parts of the printed circuit board.

A film 7, 8, needed only during manufacture of the printed circuit assembly, will be explained below in that context.

A printed circuit assembly as shown in the drawing is manufactured as follows: first slots 1 are milled into the base plate so that only crosspieces 4 remain as connections between parts 2 and 3. The conductor pattern 5 is then produced in a conventional manner.

A composite film consisting of a thermoplastic layer 7 between two sheets of non-adhesive separator film 8 is laid on middle part 2. This composite film, sold under the trademark "Contiflex Conformal Coating" by Contiflex AG, Küsnacht-Zürich, Switzerland, is normally used in compressing uneven layered structures. The dimensions of composite film 7, 8 are such that it completely covers over slots 1 and extends a bit farther.

Since film 8 may stick to the "Kapton" film 9 during the operations to be described below, it is advisable to lay another separator film, viz., a sheet (not shown) of the polyvinylidene fluoride film sold under the trademark "Tedlar" by E. I. du Pont de Nemours & Co., upon composite film 7, 8.

The lower polyimide film 9 is then laid on the middle part 2 in such a way that it extends about 5 mm. beyond the edges of film 7, 8. Between this projecting portion of film 9 and board part 3, the adhesive strip 6 of the aforementioned acrylate material "Pyralux LF 0100" is inserted. This fiber-free, thermally activated adhesive is customarily used in conventional flexible printed circuits to bond the "Kapton" films, also used there, to a rigid substrate, or to join two "Kapton" films.

Strip 6 is provisionally attached to board part 3 or to film 9 by spot-heating, e.g., with a soldering iron, before film 9 is put in place.

Sheet 10 of the aforementioned fiber-free, thermally activated adhesive film "Scotch-Weld 588", corresponding in size and positioning to composite film 7, 8, is laid upon polyimide film 9. The adhesive film 11 intended to receive the wires in wired printed circuits, containing glass-fiber fabric and likewise thermally activated, is now laid upon each of the parts 3 in such a way that the edges of films 10 and 11 abut one another.

In order to avoid mutual displacement, the stacked films are temporarily attached until the next processing step, partly by spot-heating, partly by tape which is adhesive on both sides.

The stack thus far assembled is then compressed, using suitable resilient, adhesive-repellant underlying supports, at a temperature at which the thermally activated layers just begin to flow. The discontinuity caused by the differing thicknesses of films 10 and 11 is evened out somewhat at this time.

Next, insulated wires 14 are mechanically laid in layers 11 and 10 in a manner known per se but having no direct connection with the present invention. This wire-laying operation is carried out by moving the base plate or board under a presser-foot, the wires being superficially embedded in layers 11 and 10 by vibration of the foot at supersonic frequency as a result of the heat then produced. The starting and end points and the run between them are computer-controlled. In the regions of parts 3, the wires run parallel and perpendicular to the plane of the drawing, while in the region of middle part 2, the wires run only parallel to that plane.

After completion of the wiring, non-adhering polyimide film 12 is laid over middle part 2 with its edges extending beyond underlying layer 10 in the same way as in the case of film 9. Either before or after film 12 is put in place, these projecting edges are joined to thermally activated strips 16 of the aforementioned adhesive "Pyralux LF 0100", corresponding to strips 6.

Finally, the two fiber-glass-reinforced, thermally activated "prepreg" films 13 are laid over the areas of circuit board parts 3, the size and positioning of these films corresponding to those of films 11.

After all the films have been applied, the entire stack is again compressed between suitable deformable, adhesive-repellant supports under the influence of heat, at which time the various activatable layers pass into their final state, and the wires become embedded in their underlayers to the extent shown in the drawing. The wires lying in layers 11 cannot be displaced during the compression operation owing to the effect of the fabric inlay; this is important if the course of the wires is to match precisely the pattern of holes to be made subsequently. The wires disposed in adhesive layer 10, on the other hand, are not secured against displacement during compression; this is no disadvantage, however, since no holes are bored in that region. The danger that the wires in the flexible part which are situated near slots 1 might be pushed downward and damaged during compression is precluded by the properties of composite film 7, 8; for when this film is heated and compressed, thermoplastic material emerges as shown at the location indicated by reference numeral 15, partially fills slot 1, and thereby counteracts the sagging of layers 9, 10, and 12. For appreciating this situation, the different scales used in the drawing for two directions, as explained earlier, must be taken into account.

In a manner not shown in the drawing, the printed circuit assembly as described is then covered with an additional film, and the prescribed holes which intersect wires 14 and copper conductors 5 are bored in the regions of parts 3. As already mentioned, the material of which board parts 3 and layers 11 and 13 are made contains a catalyst, while the aforementioned additional film does not. If the assembly is now immersed in a bath which copper-plates all material containing the catalyst, copper will be deposited only on the walls of the holes. After the copper-plating operation, the lastapplied film is removed.

The printed circuit assembly is thereafter equipped with discrete components by inserting the leads of these elements into the copper-plated holes. The connections are then dip-soldered in a manner known per se.

Next, crosspieces 4 are broken, whereupon the middle part 2 of the board, together with composite film 7, 8 and possibly the non-illustrated separator film, can be removed. Thus, the printed circuit assembly consists of two rigid boards connected by a flexible portion.

The invention is naturally not confined to the embodiment described above. In particular, there are presumably other thermally activated adhesive films besides "ScotchWeld 588" and "Pyralux LF 0100" which possess the appropriate properties for carrying out the invention and which might be used instead of the materials named. "Contiflex Conformal Coating" might likewise be replaced by another material having similar properties.

Although the embodiment illustrated and described comprises a three-part printed circuit assembly having a flexible part between two rigid parts, it is quite possible to connect more than two rigid parts by such interposed flexible parts. Any desired mutual arrangement of the rigid parts, and hence of the shapes and positions of the flexible parts, may be chosen.

Insofar as it is necessary to incorporate such an extensive amount of wiring that a single layer does not suffice, further wired layers (11) can be disposed one above the other in such regions in separate operations.

What is claimed is:

1. In a circuit board assembly comprising a plurality of rigid parts and at least one flexible part connecting each two said rigid parts, said flexible part comprising an upper and a lower non adhesive flexible film, the board further comprising wires, at least a part of these wires running uniterruptedly from one of said rigid parts over said flexible part to an adjacent one of said rigid parts, said wires in all parts being embedded in a layer of thermally activatable adhesive, said adhesive is, in the flexible parts, disposed between the non adhesive films, and, in the rigid parts, disposed on a rigid base plate and, including the wires, covered by a cover layer, the improvement that the non adhesive films extending solely between said two rigid parts and being secured thereto at the edges thereof and that two kinds of adhesive layers are disposed, the layer on said rigid parts containing a glass-fiber fabric and the adhesive in said flexible part is fiber-free.

2. The printed circuit assembly of claim 1, wherein an edge of each said first layer overlaps a respective edge of the one of said two sheets of film closer to said base plate, the edges of the other of said two sheets of film overlap respective edges of each said first layer, and an edge of each said second layer overlaps a respective edge of said other of two said sheets of film, each of said rigid parts further including a first thermally activated adhesive strip inserted between an edge of said base plate and said respective edge of said one of said two sheets of film, and a second thermally activated adhesive strip inserted between said edge of said second layer and said respective edge of said other of two said sheets of film.

* * * * *